United States Patent
Okumura (10) Patent No.: US 8,232,770 B2
(45) Date of Patent: Jul. 31, 2012

(54) BATTERY REMAINING CAPACITY PREDICTING APPARATUS

(75) Inventor: Masafumi Okumura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1108 days.

(21) Appl. No.: 12/022,584

(22) Filed: Jan. 30, 2008

(65) Prior Publication Data

US 2008/0180062 A1 Jul. 31, 2008

(30) Foreign Application Priority Data

Jan. 31, 2007 (JP) .................................. 2007-020448

(51) Int. Cl.
H02J 7/00 (2006.01)
G01N 27/416 (2006.01)

(52) U.S. Cl. ....................................... 320/132; 324/429

(58) Field of Classification Search .................. 320/132; 324/428–430, 433–434; 702/63–65
See application file for complete search history.

(56) References Cited

U.S. PATENT DOCUMENTS

| | | | | |
|---|---|---|---|---|
| 5,539,318 | A * | 7/1996 | Sasaki | 324/428 |
| 6,310,462 | B1 | 10/2001 | Arai et al. | |
| 7,352,156 | B2 * | 4/2008 | Ashizawa et al. | 320/132 |
| 7,728,598 | B2 * | 6/2010 | Murakami et al. | 324/429 |
| 2003/0193318 | A1 | 10/2003 | Ozawa et al. | |
| 2003/0195719 | A1 | 10/2003 | Emori et al. | |
| 2008/0077338 | A1 | 3/2008 | Wong et al. | |

FOREIGN PATENT DOCUMENTS

| | | |
|---|---|---|
| CN | 101153894 A | 4/2008 |
| JP | 06-242193 | 9/1994 |
| JP | 08-179018 | 7/1996 |
| JP | 11-223665 | 8/1999 |
| JP | 2001-186682 | 7/2001 |
| JP | 2003-307555 A | 10/2003 |
| JP | 2004-304940 | 10/2004 |
| JP | 2005-331482 | 12/2005 |
| TW | 530158 | 5/2003 |
| TW | 1260419 | 8/2006 |

OTHER PUBLICATIONS

Notice of Reason for Rejection, mailed May 17, 2011, in Japanese Application No. 2007-020448.
Chinese Office Action issued Feb. 5, 2010 in corresponding Chinese Patent Application 200810008960.7 (4 pp.), English Translation (5 pp.).
Notice of Preliminary Rejection, mailed Apr. 29, 2010 in corresponding Korean Application No. 10-2008-0010019 (7 pp.).
Taiwanese Office Action mailed Feb. 4, 2012 for corresponding Taiwanese Application No. 097103517, with English-language translation.

* cited by examiner

Primary Examiner — Richard V Muralidar
(74) Attorney, Agent, or Firm — Fujitsu Patent Center (57) ABSTRACT

To provide a technology for obtaining a remaining capacity of a battery with high accuracy. A battery remaining capacity predicting apparatus predicting a remaining capacity of a battery based on an open-circuit voltage of the battery, detects a charge current or a discharge current of the battery, integrates the currents, obtains an estimated value of the open-circuit voltage that corresponds to an integrated value of the currents on the basis of conversion information representing a capacity necessary for the open-circuit voltage of the battery to change by a predetermined capacity, obtains a measured value of the open-circuit voltage on the basis of the detected current and information on internal impedance, and obtains the remaining capacity of the battery based on the estimated value of the open-circuit voltage by correcting the information on the internal impedance so that the measured value of the open-circuit voltage is equalized to the estimated value of the open-circuit voltage, or by correcting the conversion information so that the estimated value of the open-circuit voltage is equalized to the measured value of the open-circuit voltage.

27 Claims, 9 Drawing Sheets

| VOLTAGE VALUE | CURRENT CAPACITY | VOLTAGE VALUE | CURRENT CAPACITY | VOLTAGE VALUE | CURRENT CAPACITY |
|---|---|---|---|---|---|
| | | 11.70V< | 1.176mAh | 10.30V< | 0.400mAh |
| 12.19V< | 0.645mAh | 11.49V< | 0.952mAh | 9.63V< | 0.298mAh |
| 12.01V< | 1.111mAh | 11.18V< | 0.645mAh | 8.86V< | 0.260mAh |
| 11.87V< | 1.429mAh | 10.80V< | 0.526mAh | | |

FIG. 5

| REMAINING CAPACITY | VOLTAGE VALUE | REMAINING CAPACITY | VOLTAGE VALUE | REMAINING CAPACITY | VOLTAGE VALUE |
|---|---|---|---|---|---|
| 100% | 12.50V | 60% | 11.70V | 20% | 10.30V |
| 90% | 12.19V | 50% | 11.49V | 10% | 9.63V |
| 80% | 12.01V | 40% | 11.18V | 0% | 8.86V |
| 70% | 11.87V | 30% | 10.80V | | |

BATTERY REMAINING CAPACITY PREDICTING APPARATUS

This application claims the benefit of Japanese Patent Application No. 2007-020448 filed on Jan. 31, 2007 in the Japanese Patent Office, the disclosure of which is herein incorporated in its entirety by reference.

BACKGROUND OF THE INVENTION

The present invention relates to a technology of predicting a remaining capacity of a battery.

To roughly classify a conventional system for predicting a remaining capacity of a battery, two types of systems have hitherto been employed.

One type of predicting system is a current integration system that integrates charge/discharge currents and predicts a current capacity remaining in the battery, and this type of system is used in most cases generally when requiring accuracy.

In the current integration system, to begin with, at a point of time when detecting a full-charge state, a predetermined full-charge capacity is set in a remaining capacity. At first, the full-charge capacity is substituted with a related capacity.

When starting the discharge, the discharge currents are integrated, then a remaining capacity is obtained by subtracting the integrated current from the full-charge capacity, and a percentage is acquired at a ratio of the full-charge capacity to the remaining capacity.

For example, in the case of the battery of which the rated capacity is on the order of 2000 mAh, the remaining capacity is set to 2000 mAh when detecting the full-charge state. Then, in the case of conducting the discharge for 10 min when the current is on the order of 1.8 A, the remaining capacity is obtained such as 2000 mAh−1800 mA×10/60 (h)=1700 mAh, and the percentage of the remaining capacity is given by 1700/2000×100=85%.

Another system is an open-circuit voltage system that predicts the remaining capacity from the open-circuit voltage of the battery.

In the open-circuit voltage system, a table is generated by previously obtaining a relation between the open-circuit voltage and the remaining capacity of the battery, and the remaining capacity corresponding to the open-circuit voltage of the battery is obtained by referring to the table. Herein, the open-circuit voltage may be directly measured if the battery is in a state where neither the charge nor the discharge is conducted, however, during the charge/discharge process, the charge/discharge currents are measured, and the open-circuit voltage is obtained from information on internal impedance.

For instance, the open-circuit voltage (OCV) can be inferred by the following formula, where V is a voltage of the battery, I is a charge/discharge current, and Ri is internal impedance of the battery.

$$OCV = V + Ri \times I$$

Moreover, for example, technologies disclosed in the following Patent documents 1-4 are given as the prior arts related to the invention of the present application.

[Patent Document 1]
Japanese Patent Application Laid-Open Publication No. 11-223665
[Patent Document 2]
Japanese Patent Application Laid-Open Publication No. 2005-331482
[Patent Document 3]
Japanese Patent Application Laid-Open Publication No. 6-242193
[Patent Document 4]
Japanese Patent Application Laid-Open Publication No. 8-179018

SUMMARY OF THE INVENTION

The current integration system has a highly acceptable level in terms of continuity and linearity of the predictive remaining capacity but is disabled to predict an accurate remaining capacity if the full-charge capacity is inaccurate. The battery, because of the full-charge capacity being decreased due to deterioration, needs correcting the full-charge capacity. If continuously used without correcting the full-charge capacity, such a problem arises that a higher remaining capacity than the actual remaining capacity is indicated because of the full-charge capacity being reduced due to the deterioration. Further, when a computer gets into a standby status and into a stopping status for a long period of time, the discharge current is minute, and a self discharge capacity increases, in which case another problem is that an error occurs in the integrated value of the currents, resulting in a decrease in the accuracy of the predictive remaining capacity.

Moreover, the open-circuit voltage system entails the high accuracy and high resolution for measuring the voltage, wherein calculations for correcting a temperature, the current, the deterioration and the time are not easy operations, and it is difficult to predict the remaining capacity with the high accuracy. There is also a problem, in which, for example, a lower remaining capacity than the actual remaining capacity is displayed unless the deterioration is corrected properly.

In the case of correcting these elements, the corrections can be done only at a specified timing such as when detecting the full-charge state and when a device becoming a load gets into the standby status, and the accuracy can not be improved by increasing a frequency of the corrections.

Such being the case, the present invention provides a technology for obtaining the remaining capacity of the battery with the high accuracy.

The present invention adopts the following configurations in order to solve the problems.

Namely, a battery remaining capacity predicting apparatus according to the present invention comprises:

an integrating unit integrating current values of charge or discharge of a battery;

a storage unit stored with conversion information representing a capacity necessary for an open-circuit voltage of the battery to change by a predetermined capacity; and an estimating unit obtaining an estimated value of the open-circuit voltage, which corresponds to the integrated value of the currents, on the basis of the conversion information in the storage unit.

The battery remaining capacity predicting apparatus may further comprise a remaining capacity predicting unit obtaining a remaining capacity of the battery on the basis of the estimated value of the open-circuit voltage.

The battery remaining capacity predicting apparatus may further comprise:

a measuring unit obtaining a measured value of the open-circuit voltage on the basis of a charge current or a discharge current of the battery and information on the internal impedance of the battery; and a correcting unit correcting the information on the internal impedance so that the measured value of the open-circuit voltage is equalized to the estimated value of the open-circuit voltage.

The battery remaining capacity predicting apparatus may further comprise:

a measuring unit obtaining a measured value of the open-circuit voltage on the basis of a charge current or a discharge current of the battery and information on the internal impedance of the battery; and a correcting unit correcting the conversion information so that the estimated value of the open-circuit voltage is equalized to the measured value of the open-circuit voltage.

A battery remaining capacity predicting apparatus may further comprise:

a measuring unit obtaining a measured value of the open-circuit voltage on the basis of a charge current or a discharge current of the battery and information on the internal impedance of the battery; and a correcting unit correcting the information on the internal impedance so that the measured value of the open-circuit voltage is equalized to the estimated value of the open-circuit voltage, or correcting the conversion information so that the estimated value of the open-circuit voltage is equalized to the measured value of the open-circuit voltage.

In the battery remaining capacity predicting apparatus, wherein the correction may be made only when charging the battery with electricity or only when discharging the electricity from the battery.

In the battery remaining capacity predicting apparatus, wherein when the remaining capacity of the battery is within a predetermined range, the correcting unit may perform the correction.

When the voltage of the battery is within a predetermined range, the correcting unit may perform the correction.

When a load of the battery becomes less than a predetermined load, the correcting unit may perform the correction.

When stopping the charge and the discharge of the battery, the correcting unit may perform the correction.

The correcting unit may perform the correction at intervals of a predetermined period of time.

The correcting unit may be enabled to select whether the correction is done automatically at an execution-of-correction timing or the correction is done in accordance with a manual operation of a user.

Further, an electronic device according to the present invention comprises:

the said battery remaining capacity predicting apparatus;

a determining unit determining, depending on whether or not at least one of an estimated value of an open-circuit voltage, a measured value of the open-circuit voltage, conversion information and information on internal impedance satisfies a predetermined condition, whether a remaining capacity of the battery is within predetermined accuracy or not; and a notification control unit notifying of a result of the determination.

Still further, an electronic device according to the present invention comprises:

the said battery remaining capacity predicting apparatus; and a notification control unit notifying of whether the correction is done or not.

Yet further, a battery remaining capacity predicting method according to the present invention is a method by which a battery remaining capacity predicting apparatus predicting a remaining capacity of a battery on the basis of an open-circuit voltage of the battery, executes:

integrating charge or discharge current values of the battery; and obtaining an estimated value of the open-circuit voltage in accordance with an integrated value of the current values on the basis of conversion information representing a capacity necessary for the open-circuit voltage of the battery to change by a predetermined capacity.

In the battery remaining capacity predicting method, current values of the charge or the discharge of the battery may be detected and then integrated. Moreover, the remaining capacity of the battery may be obtained based on an estimated value of the open-circuit voltage.

In the battery remaining capacity predicting method, a measured value of the open-circuit voltage may be obtained based on the charge or discharge current of the battery and information on internal impedance of the battery, and the information on the internal impedance may be corrected so that the measured value of the open-circuit voltage is equalized to the estimated value of the open-circuit voltage.

In the battery remaining capacity predicting method, a measured value of the open-circuit voltage may be obtained based on the charge or discharge current of the battery and information on internal impedance of the battery, and the conversion information may be corrected so that the estimated value of the open-circuit voltage is equalized to the measured value of the open-circuit voltage.

In the battery remaining capacity predicting method, a measured value of the open-circuit voltage may be obtained based on the charge or discharge current of the battery and information on internal impedance of the battery, and the information on the internal impedance may be corrected so that the measured value of the open-circuit voltage is equalized to the estimated value of the open-circuit voltage, or the conversion information may be corrected so that the estimated value of the open-circuit voltage is equalized to the measured value of the open-circuit voltage.

Furthermore, the present invention may also be a battery remaining capacity predicting program that makes the apparatus execute the battery remaining capacity predicting method. Moreover, the present invention may also be a recording medium recorded with the battery remaining capacity predicting program readable by a device such as a computer. The computer is made to read and execute the program on the recording medium, whereby the functions thereof can be provided.

Herein, the recording medium connotes a recording medium capable of storing information such as data, programs, etc. electrically, magnetically, optically, mechanically or by chemical action, which can be read from the device. A hard disc, a ROM (Read-Only Memory), etc. are given as the recording mediums fixed within the computer.

According to the present invention, it is possible to provide the technology of obtaining the remaining capacity of the battery with the high accuracy.

DETAILED DESCRIPTION OF THE PREFERRED EMBODIMENT

A best mode for carrying out the present invention will hereinafter be described with reference to the drawings. A configuration in the following embodiment is an exemplification, and the present invention is not limited to the configuration in the embodiment.

Figure 1:
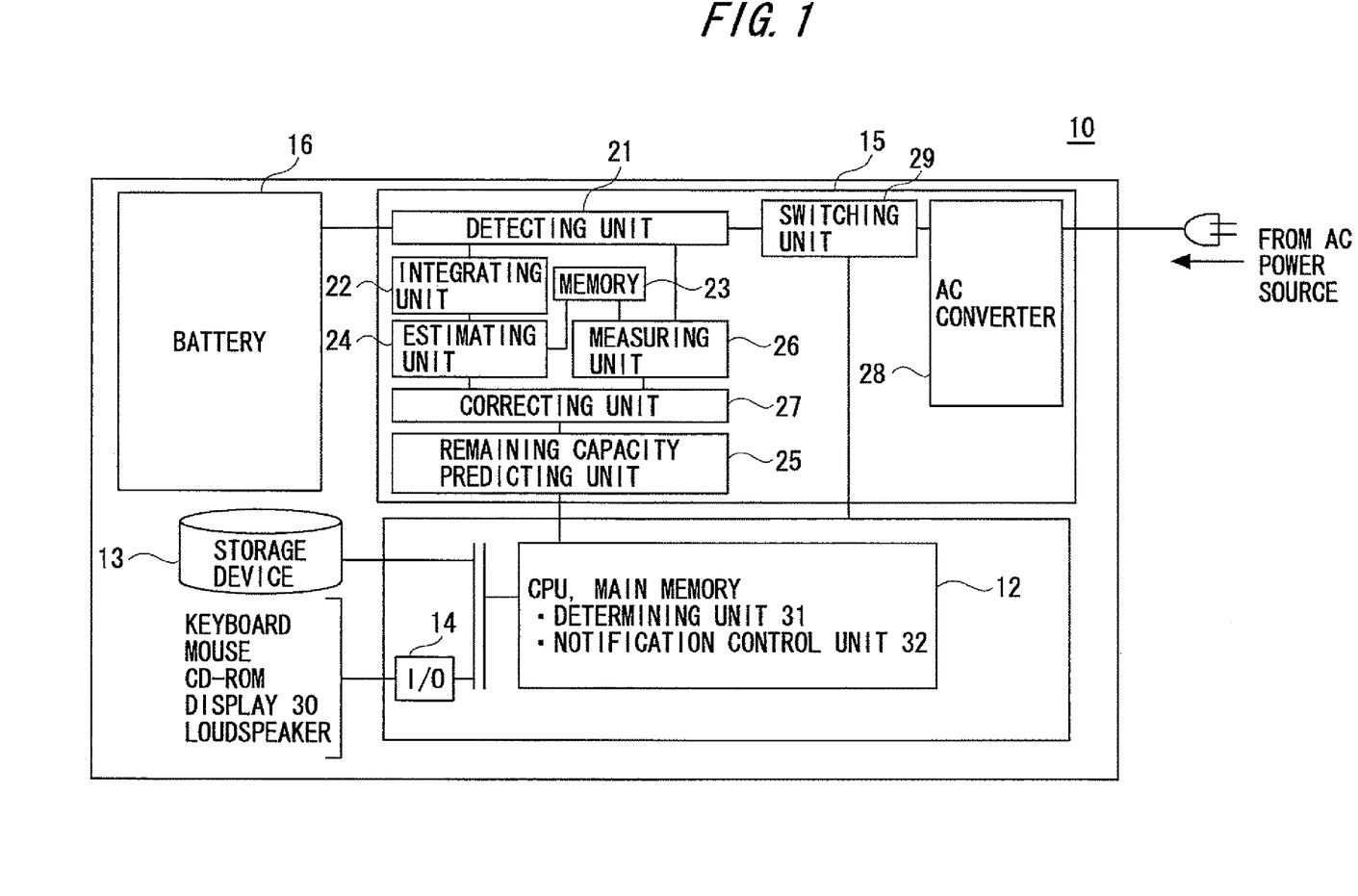
FIG. 1 is a diagram of outlines of an electronic device and a remaining capacity predicting apparatus according to the present invention.

FIG. 1 is a diagram showing an outline of an electronic device according to the present invention. An electronic device 10 is a hand-held type computer constructed in a notebook size, which has a built-in battery.

The electronic device 10 includes an arithmetic processing unit 12 constructed of a CPU (Central Processing Unit), a main memory, etc, a storage device (hard disk) 13 stored with data and software for an arithmetic process, an input/output port 14, a power source apparatus 15, a battery 16 and so on.

The storage device 13 is preinstalled with an operating system (OS) and application software.

Input devices such as a keyboard, a mouse and a CD-ROM drive and output devices such as a display (display unit) 30 and a loudspeaker are properly connected to the input/output port 14.

The power source apparatus 15 supplies electric power given from the battery 16 or an AC power source to respective units within the electronic device. The power source apparatus 15 includes a detecting unit 21, an integrating unit 22, a memory (storage unit) 23, an estimating unit 24, a remaining capacity predicting unit 25, a measuring unit 26, a correcting unit 27, an AC converting unit 28 and a switching unit 29, and functions also as a remaining capacity predicting device according to the present invention.

The detecting unit 21 detects a charge current or a discharge current of the battery 16. The integrating unit 22 integrates the currents detected by the detecting unit 21.

The memory 23 is stored with a current-voltage table containing pieces of conversion information representing a capacity necessary for an open-circuit voltage of the battery 16 to change by a predetermined capacity, a voltage-capacity table showing a corresponding relation between the open-circuit voltage and a remaining capacity of the battery 16, and items of information such as set values of a voltage (full-charge voltage) and of a capacity (full-charge capacity) when fully charged, an estimated value of the open-circuit voltage and internal impedance of the battery 16.

The estimating unit 24 obtains an estimated value of the open-circuit voltage corresponding to an integrated value of the current on the basis of the conversion information in the memory 23.

The remaining capacity predicting unit 25 refers to the voltage-remaining capacity table in the memory 23, and obtains a remaining capacity of the battery 16 on the basis of an estimated value of the open-circuit voltage acquired by the estimating unit 24 or a measured value acquired by the measuring unit 26.

The measuring unit 26 obtains a measured value of the open-circuit voltage on the basis of information on the current detected by the detecting unit 21 and information on the internal impedance of the battery 16.

The correcting unit 27 corrects the conversion information or the internal impedance on the basis of the measured value of the open-circuit voltage and the estimated value of the open-circuit voltage. For example, the information on the internal impedance is corrected so that the measured value of the open-circuit voltage is equalized to the estimated value thereof, or alternatively the conversion information is corrected so that the estimated value of the open-circuit voltage is equalized to the measured value thereof.

The AC converting unit 28 is connected to an external AC power source for charging the battery 16 with the electricity, and converts an alternate current supplied from the AC power source into a direct current.

The switching unit 29 detects the connection to the AC power source, and performs switchover in a way that supplies the electric power converted by the AC converting unit 28 and given from the AC power source to the respective units within the electronic device when connected to the AC power source and supplies the electric power given from the battery 16 to the respective units when not connected to the AC power source. Further, the switching unit 29 detects whether the battery 16 is in a full-charge state or not, and charges the battery 16 with the electricity by supplying the battery 16 with the electric power from the AC power source if the battery 16 is not in the full-charge state but stops charging when reaching the full-charge state. Further, the switching unit 29 detects an end of the discharge (remaining capacity; 0%), detachment of the battery and attachment of the battery.

It should be noted that the present embodiment has exemplified the example in which the respective units 21-29 of the power source apparatus (remaining capacity predicting apparatus) are constructed of dedicated electronic circuits, however, without being limited to this example, such a scheme may also be taken that the functions of the respective units 21-29 are realized by making a general-purpose processor (processing device) execute a program (remaining capacity predicting program) such as firmware and a driver.

A remaining capacity predicting method in the electronic device 10 having the construction given above will hereinafter be described.

Figure 2:
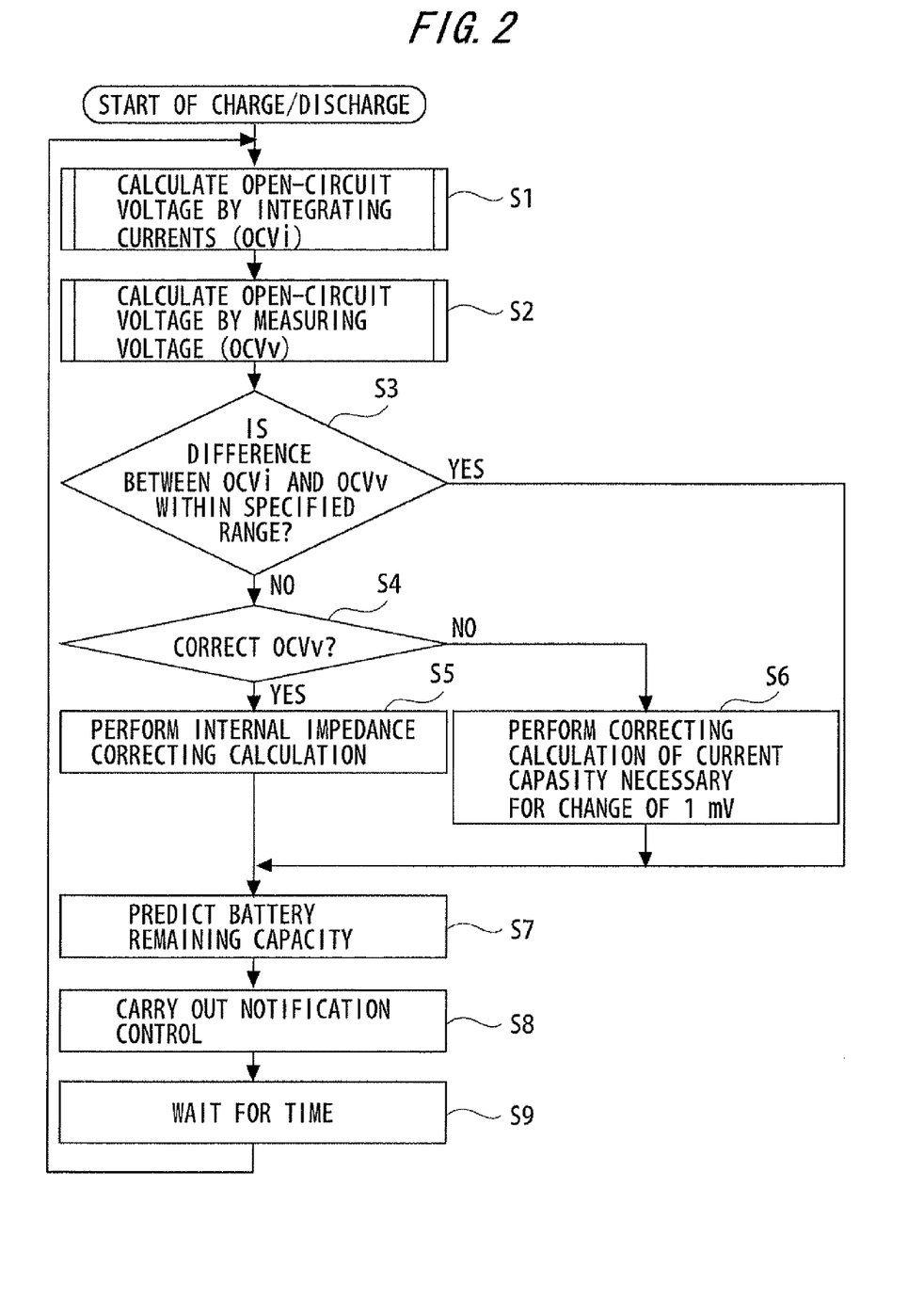
FIG. 2 is an explanatory flowchart of a remaining capacity predicting method.
Figure 3:
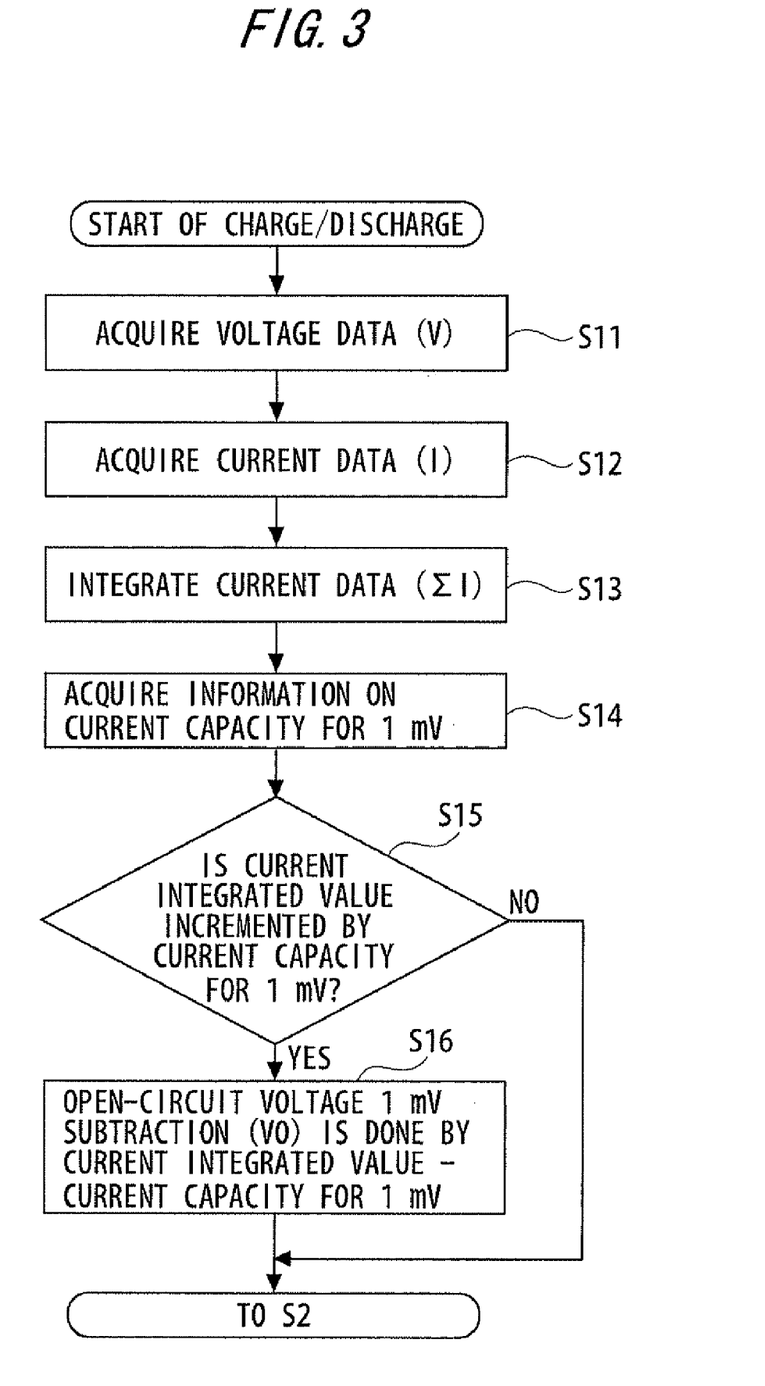
FIG. 3 is an explanatory flowchart of a process for obtaining an estimated value of an open-circuit voltage.

FIG. 2 is a flowchart of the remaining capacity predicting method according to the present invention, and FIG. 3 is a flowchart of a process of obtaining an estimated value of the open-circuit voltage from an integrated current.

The power source apparatus (remaining capacity predicting apparatus) 15 calculates an open-circuit voltage estimated value (OCVi) by integrating the currents (step 1, which will hereinafter also be abbreviated to S1).

In step 1, as illustrated in FIG. 3, to begin with, the estimating unit 24 acquires voltage data from the memory 23 (S11). At this time, after the switching unit 29 has detected the full-charge state, if it is the first acquisition, a set value of the full-charge voltage is read out, and, if it is the second or posterior acquisition, the estimated value of the open-circuit voltage, which has been acquired last time, is read out.

Next, the detecting unit 21 detects the charge current or the discharge current of the battery 16 (S12), and the integrating unit 22 integrates the currents (S83).

Figure 4:
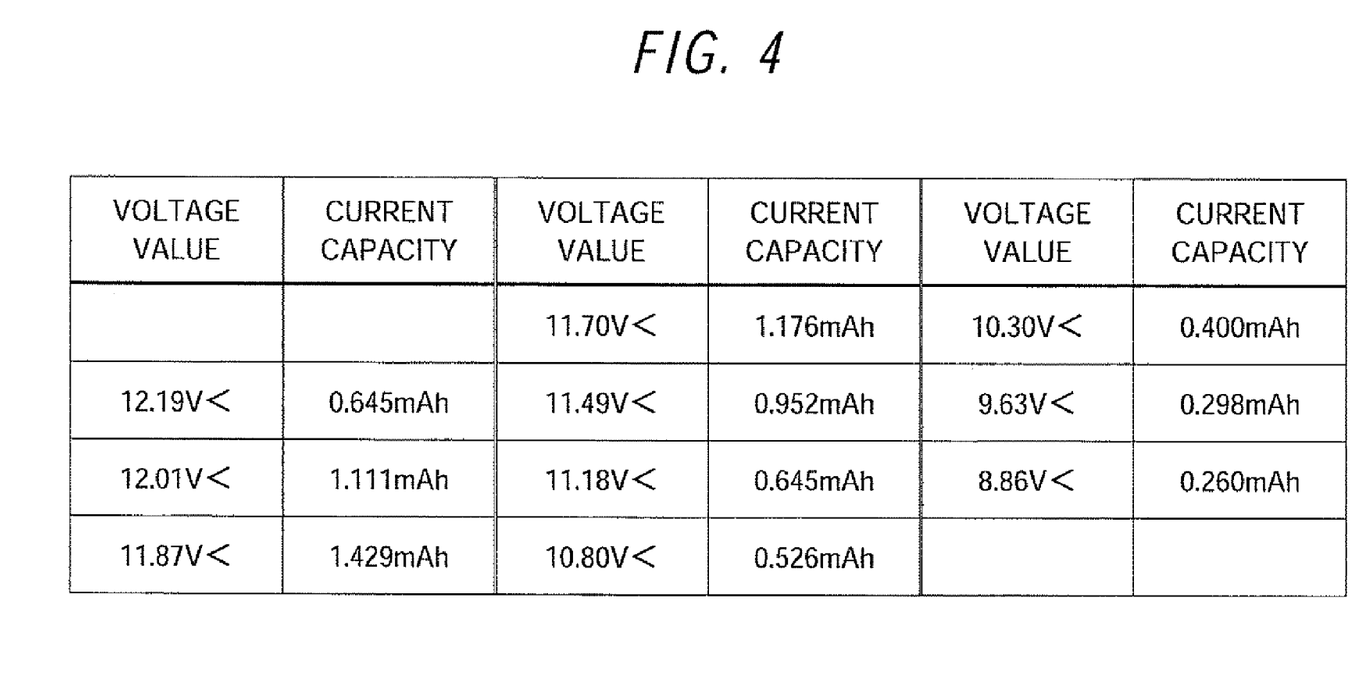
FIG. 4 is a diagram showing an example of a current-voltage table.

Further, the estimating unit 24 refers to the current-voltage table (FIG. 4) in the memory 23, and thus acquires a capacity necessary for the open-circuit voltage to change by a predetermined capacity (that is on the order of 1 mV in the present embodiment) (S14). The present embodiment involves using the table showing the current capacities corresponding to the open-circuit voltage values at a plurality of stages, however, without being limited to the table format, the current capacities may also be shown by functions etc on condition of representing the corresponding relation between the open-circuit voltages and the current capacities. Moreover, a plurality of tables (conversion information) may be provided according to respective conditions such as temperatures, types of batteries, etc and may be switched over corresponding to the conditions.

Then, the estimating unit 24 determines whether or not the current integrated value is incremented by 1 mV (S15). If the current integrated value is incremented by 1 mV, an estimated value of the open-circuit voltage is obtained by adding or subtracting 1 mV to or from the voltage data acquired in step 11, and this estimated value is stored in the memory 23, thus updating the estimated value (S16). Namely, 1 mV is subtracted from the voltage data if discharged but is added to the voltage data if charged.

For example, it is assumed that 0.5 mAh is given as a current capacity needed for a change of 1 mV. When discharged for 1 sec at 1.8 A, a calculation is that 1800 (mA)× 1/3600 (hour)/0.5 (mAh)=1, and the open-circuit voltage decreases by 1 mV. Hence, a new predictive open-circuit voltage is set by subtracting 1 mV from the previous open-circuit voltage. The predictive open-circuit voltage is updated by repeating this process. If the open-circuit voltage of the last time is 16400 mV, the predictive open-circuit voltage is updated to 16399 mV.

While on the other hand, if not incremented by 1 mV in step 15, the processing proceeds to next step (S2 in the present embodiment) without updating the open-circuit voltage.

In step 2, the measuring unit 26 measures the voltage (V) of the battery 16, then acquires information on internal impedance (Ri) of the battery 16 from the memory 23, and obtains a measured value (OCVv), corresponding to the current (I) detected by the detecting unit 21, of the open-circuit voltage in the following formula.

$$OCVv = V + Ri \times I$$

For example, if 200 mΩ is given as the internal impedance, and an assumption is that the battery voltage is on the order of 16.0 V with a flow of the discharge current of 1.8 A. In this case, the open-circuit voltage is given such as 16000 (mV)+ 200 (mΩ)×1.8=16360 (mV).

Next, the correcting unit 27 determines whether or not a difference between the estimated value of the open-circuit voltage and the measured value thereof is within a predetermined range (S3), and, if not within the range, performs the value correction (S4-S6). At this time, the correcting unit 27 determines which value, the measured value of the open-circuit voltage or the estimated value thereof (S4), and, in the case of correcting the measured value, corrects the internal impedance so that the measured value is equalized to the estimated value (S5). Further, in the case of correcting the estimated value, the correcting unit 27 corrects the conversion information so that the estimated value is equalized to the measured value (S6). Note that the correction may be performed only when charged or only when discharged, and the processing may skip over to step 7 when otherwise operated.

Furthermore, in step 3, if the difference between the estimated value of the open-circuit voltage and the measured value thereof falls within the predetermined range, these values are not corrected.

Figure 5:
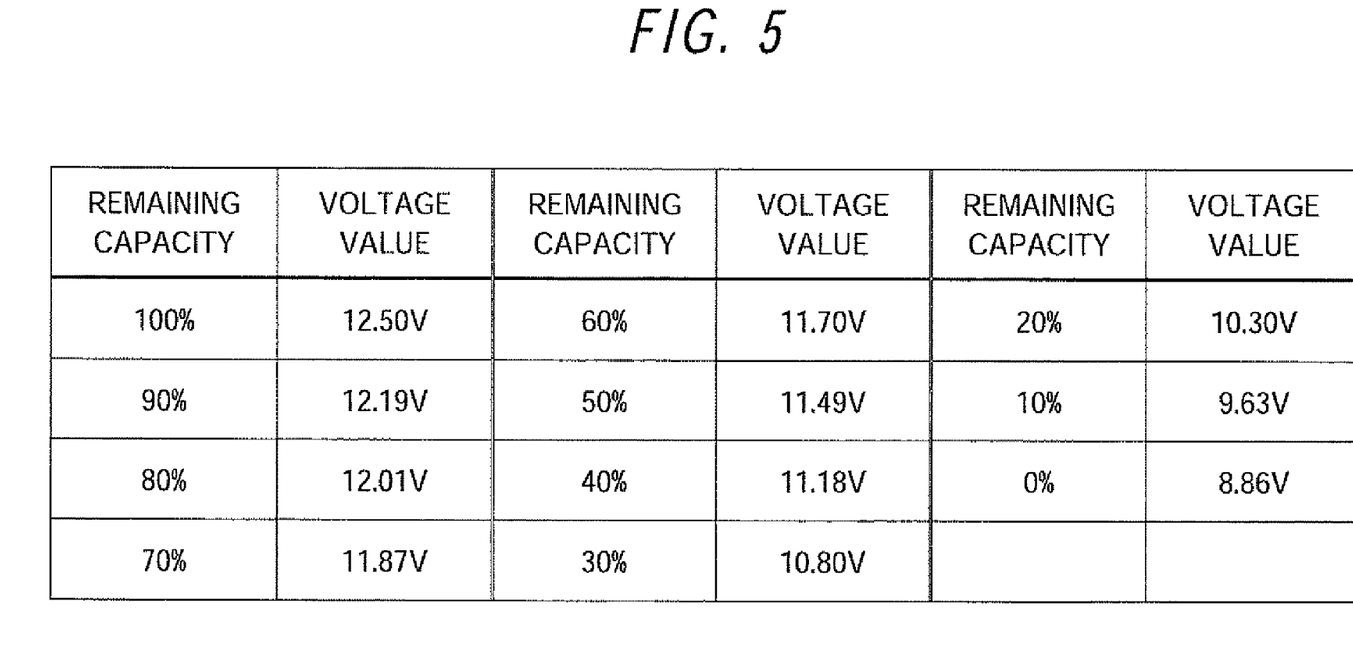
FIG. 5 is a diagram showing an example of a voltage-remaining capacity table.

Then, the remaining capacity predicting unit 25 obtains a remaining capacity of the battery 16 corresponding to the estimated value of the open-circuit voltage from the voltage-remaining capacity table (FIG. 5) in the memory 23 (S7) and notifies a user of the remaining capacity as will be described later on (S8). Further, these steps 1-8 are repeated at an interval of a predetermined period of time (the interval of 1 sec is set in the present embodiment) (S9).

In step 4, note that a criterion for determining which value, the estimated value of the open-circuit voltage or the measured value thereof, is corrected may arbitrarily be set corresponding to a characteristic of the battery, a usage state of the battery, etc.

For example, the determination is made based on the following criteria (1)-(9).

(1) If the remaining capacity of the battery is equal to or larger than a threshold value, the measured value is corrected, and, if less than the threshold value, the estimated value is corrected, in which way a battery remaining capacity range for correcting the measured value and a battery remaining capacity range for correcting the estimated value are predetermined.

(2) If the estimated value or the measured value of the open-circuit voltage is equal to or larger than a threshold value, the measured value is corrected, and, if less than the threshold value, the estimated value is corrected, in which way a voltage range for correcting the measured value and a voltage range for correcting the estimated value are predetermined.

(3) If a status such as a standby status with power consumption being less than a threshold value continues for a predetermined period of time or longer, the conversion information is corrected so that the estimated value is equalized to the measured value.

(4) If neither the charge nor the discharge of the battery 16 is conducted, or if the power consumption is as small as being ignorable in the standby status or the like, the voltage of the battery is measured and then set as the open-circuit voltage, and the conversion information and the internal impedance are corrected so that a value of the open-circuit voltage, the estimated value and the measured value become coincident with each other.

(5) After starting the discharge, if within the predetermined period of time, the integrated capacity is considered to have a small error, and hence the internal impedance is corrected so that the measured value is equalized to the estimated value.

(6) During the charge/discharge, the estimated value is compared periodically (e.g., at an interval of 1 min) with the measured value, and, if a difference therebetween gradually increases or gradually decreases, which leads a notion that the capacity necessary for a change of 1 mV has an error, consequently the conversion information is corrected.

(7) During the charge, a value of the battery voltage (open-circuit voltage) measured in a way that stops charging is compared periodically (e.g., at an interval of 10 min) with the estimated value, and, if there is a difference therebetween, the conversion information is corrected so that the estimated value becomes coincident with the open-circuit voltage.

(8) When discharged down to a discharge terminal stage (the remaining capacity is 0) from a full-charge stage, an integrated value of the currents, which is obtained by the integrating unit 22, down to the discharge terminal stage from the discharge starting stage, is set as a new full-charge capacity, and the conversion information is corrected based on this full-charge capacity. For example, a rate of the new full-charge capacity to the last full-charge capacity stored in the memory 23 is obtained, and each capacity (the capacity necessary for the change of 1 mV) in the current-voltage table is recalculated based on this rate. Then, the new full-charge capacity is stored in the memory 23, thereby updating the set value.

(9) When the battery is charged with the electricity up to the full-charge state from a complete discharge state, the full-charge capacity is obtained by integrating the charge current capacities and by correcting the integrated value at charge efficiency. The conversion information is corrected based on this full-charge capacity in the same way as (8).

Thus, the errors in the conversion information and in the information on the internal impedance are can be cancelled through the reciprocal corrections with the estimated value obtained by integrating the currents and the measured value obtained by measuring the current and the voltage, thereby enabling the battery remaining capacity to be obtained with high accuracy.

Next, control of notification etc in step 8 will be explained in detail.

The arithmetic processing unit 12 of the electronic device 10 properly reads the OS and application programs from the storage device 13 and executes the OS and the application programs, and further arithmetically processes the information inputted from the input/output port 14 and the power source apparatus 15 and the information read from the storage device 13, thereby functioning also as a determining unit 31 and a notification control unit 32.

The determining unit 31 determines, depending on whether or not at least one of the estimated value of the open-circuit voltage, the measured value of the open-circuit voltage, the conversion information and the internal impedance information satisfies a predetermined condition, whether the remaining capacity of the battery is within predetermined accuracy or not.

Figure 6:
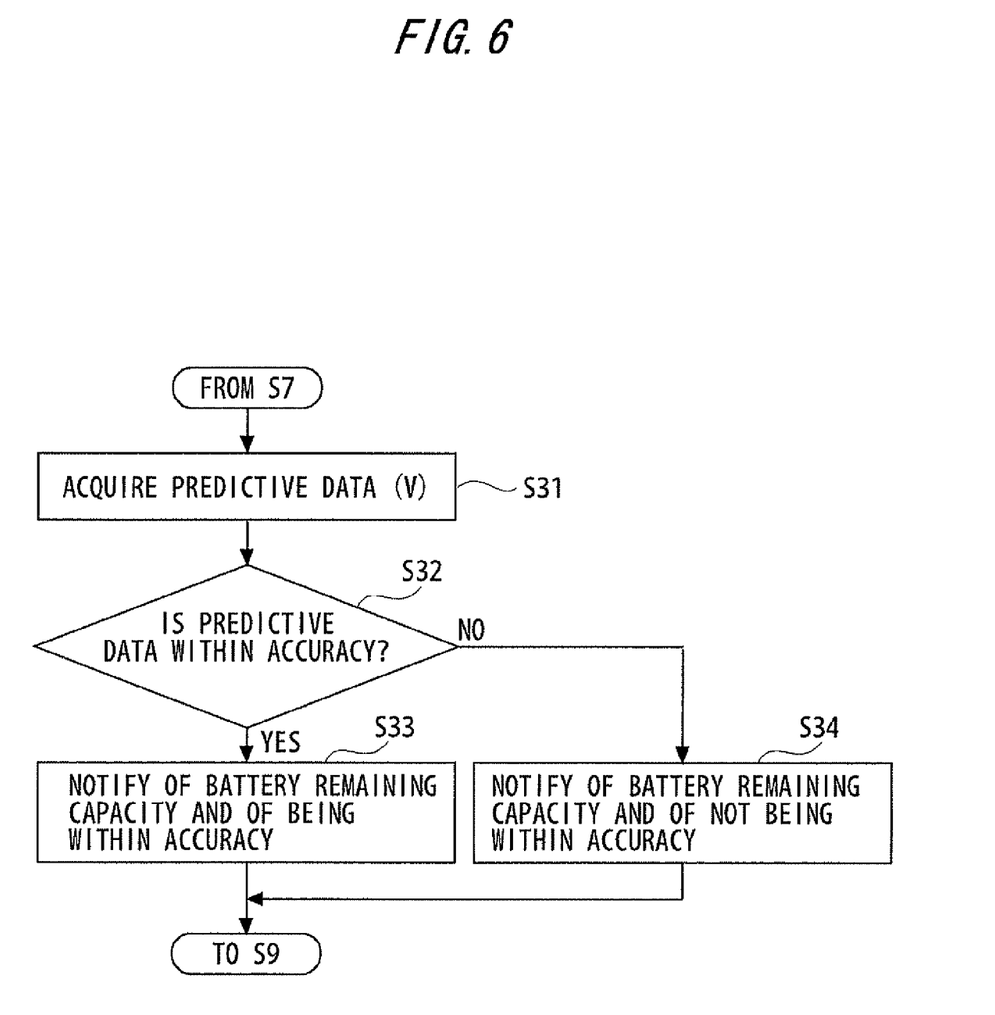
FIG. 6 is an explanatory diagram of notification control.

Further, the notification control unit 32 notifies a user of a result of the determination made by the determining unit 31 and of whether the correction is made or not through displaying on the display unit 30 and through an output of sounds from the loudspeaker FIG. 6 is an explanatory diagram of the notification control by the electronic device 10.

To start with, the determining unit 31 acquires predictive data such as the predictive remaining capacity of the battery, the estimated value of the open-circuit voltage and the measured value thereof from the power source apparatus 15 (S31)

The determining unit 31 determines whether the predictive data meets the predetermined condition or not (S32). The condition may be sufficient if capable of determining the accuracy of the battery remaining capacity on the basis of the predictive data and is not limited in particular. For example, the following conditions (1)-(6) may also be available.

(1) When a predetermined period of time elapses since a last correction has been conducted finally, this is determined to be out of the accuracy.

(2) If the discharge or the charge of a predetermined capacity of current is conducted after a last correction has been made finally, this is determined to be out of the accuracy.

(3) If the battery is temporarily detached from the device, this is determined to be out of the accuracy.

(4) In a system that performs the correction only when discharged, if the charge takes place, this is determined to be out of the accuracy.

(5) In such a case that there are plural correction elements such as the internal impedance and the capacity needed for the change of 1 mV, if even one correction element is applied to the conditions (1)-(4), this is determined to be out of the accuracy, and, if all the correction elements are within the accuracy, this is determined to be within the accuracy as the device.

(6) In the case where there are the plural correction elements, if all the correction elements are applied to the conditions (1)-(4), this is determined to be out of the accuracy, and, if any one of the correction elements is within the accuracy, this is determined to be within the accuracy as the device.

Figure 7:
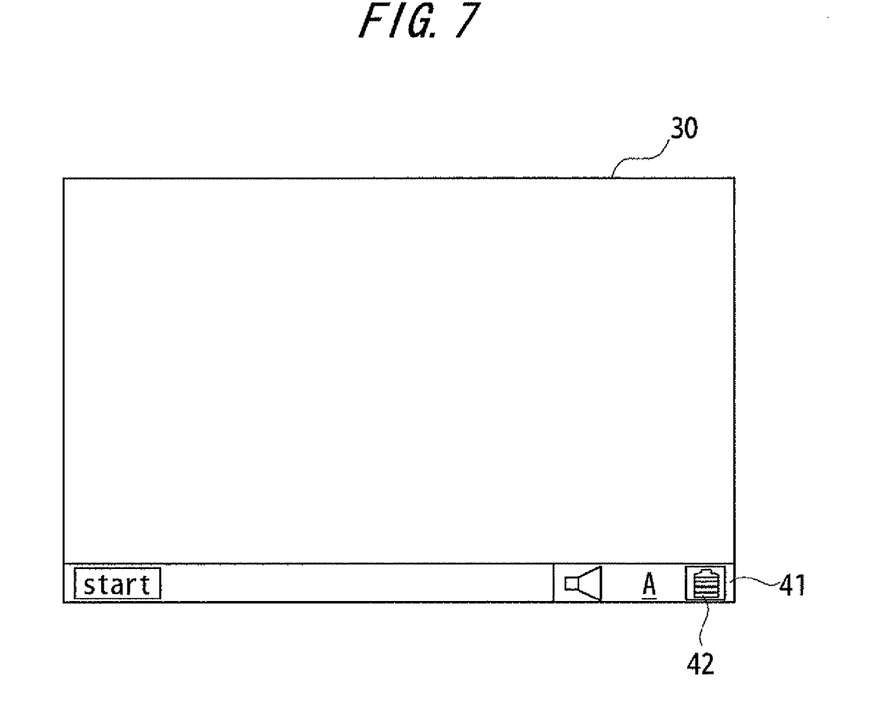
FIG. 7 is a diagram showing an example of notifying of the battery remaining capacity.
Figure 8:
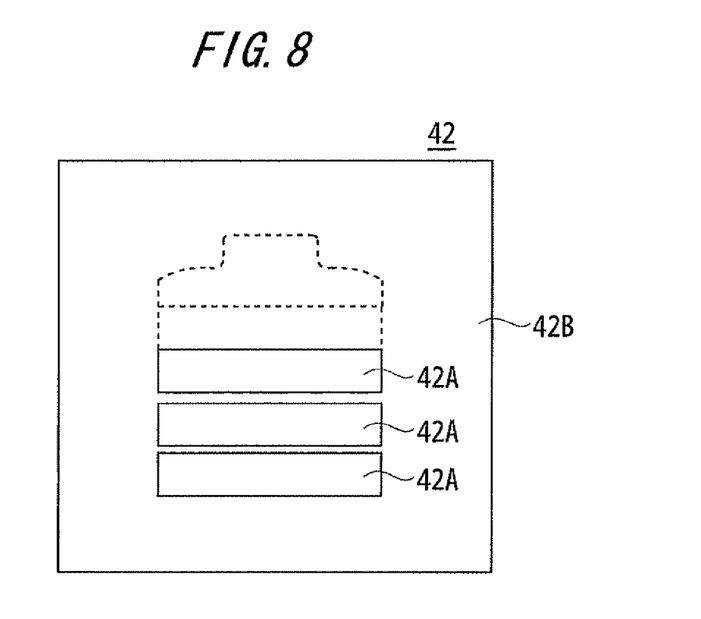
FIG. 8 is an explanatory diagram of an icon indicating the battery remaining capacity.
Figure 9:
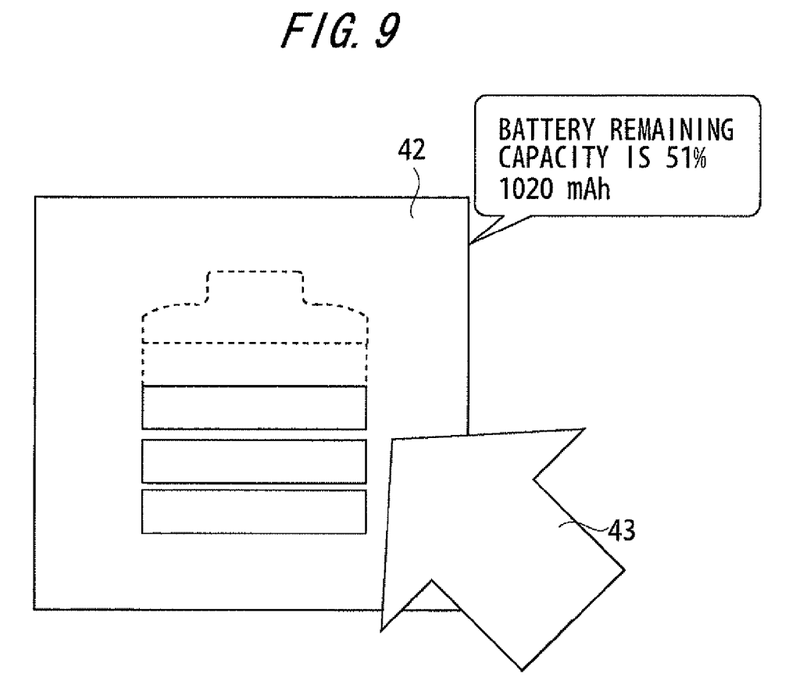
FIG. 9 is an explanatory diagram of the icon indicating the battery remaining capacity.

Then, the notification control unit 32 notifies of the battery remaining capacity together with the result of this determination (S33, S34) FIG. 7 shows an example of notifying of the battery remaining capacity. As illustrated in FIG. 7, in the present embodiment, an icon 42 representing the remaining capacity of the battery is displayed in part of a task bar 41 provided along one side of the display 30. The icon 42 has an oblique line portion 42A that changes at five stages to indicate the remaining capacity of the battery at intervals of 20%. FIG. 8 illustrates a 60% state. Further, minute levels of the battery remaining capacity and the capacity may also be displayed as illustrated in FIG. 9, corresponding to an operation such as pointing with a mouse icon 43.

At this time, a content of the notification is switched over corresponding to whether the remaining capacity of the battery is within the predetermined accuracy or not. In the present embodiment, a color of a background 42B is set to green when within the predetermined accuracy and is set to red when not within the predetermined accuracy.

Figure 10:
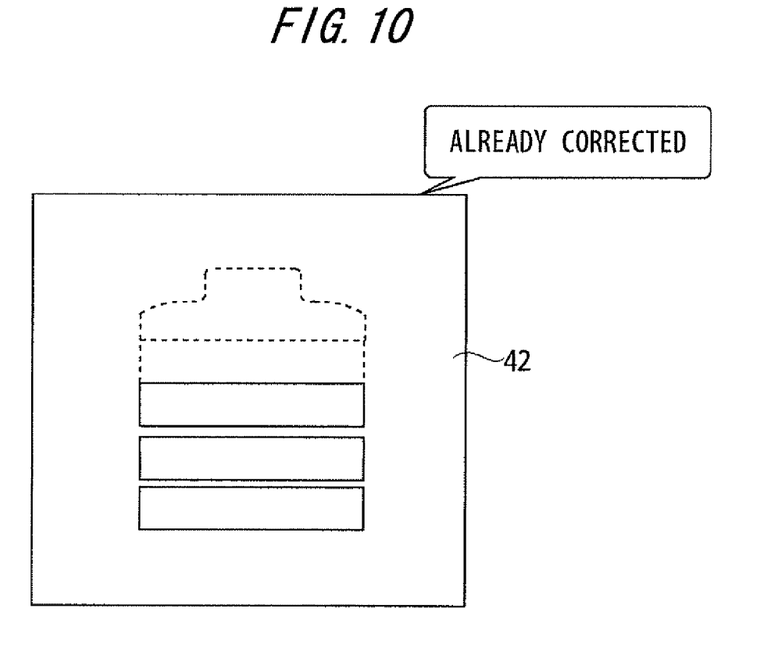
FIG. 10 is an explanatory diagram of the icon indicating the battery remaining capacity.

Moreover, the correction is made, and, if the determining unit 31 determines that it is before the predetermined time, the notification control unit 32 notifies of the correction's being done through a predetermined operation such as flickering the icon 42 and by a message as shown in FIG. 10.

Further, the notification control unit 32 may, without limiting the notification mode to the display, give the notification by a predetermined sound and voice.

As described above, according to the present embodiment, it is feasible to notify of the battery remaining capacity with the high accuracy. Especially, the reciprocal corrections with the measured value of the open-circuit voltage and the estimated value thereof enable the error to be corrected while doing the charge and the discharge without being limited to only the specified timing such as when fully-charged and when finishing the discharge, whereby a more accurate remaining capacity can be predicted.

Moreover, the notification of whether the remaining capacity of the battery is within the predetermined accuracy or not is given, thereby enhancing the reliability of the notified remaining capacity.

MODIFIED EXAMPLE

Figure 11:
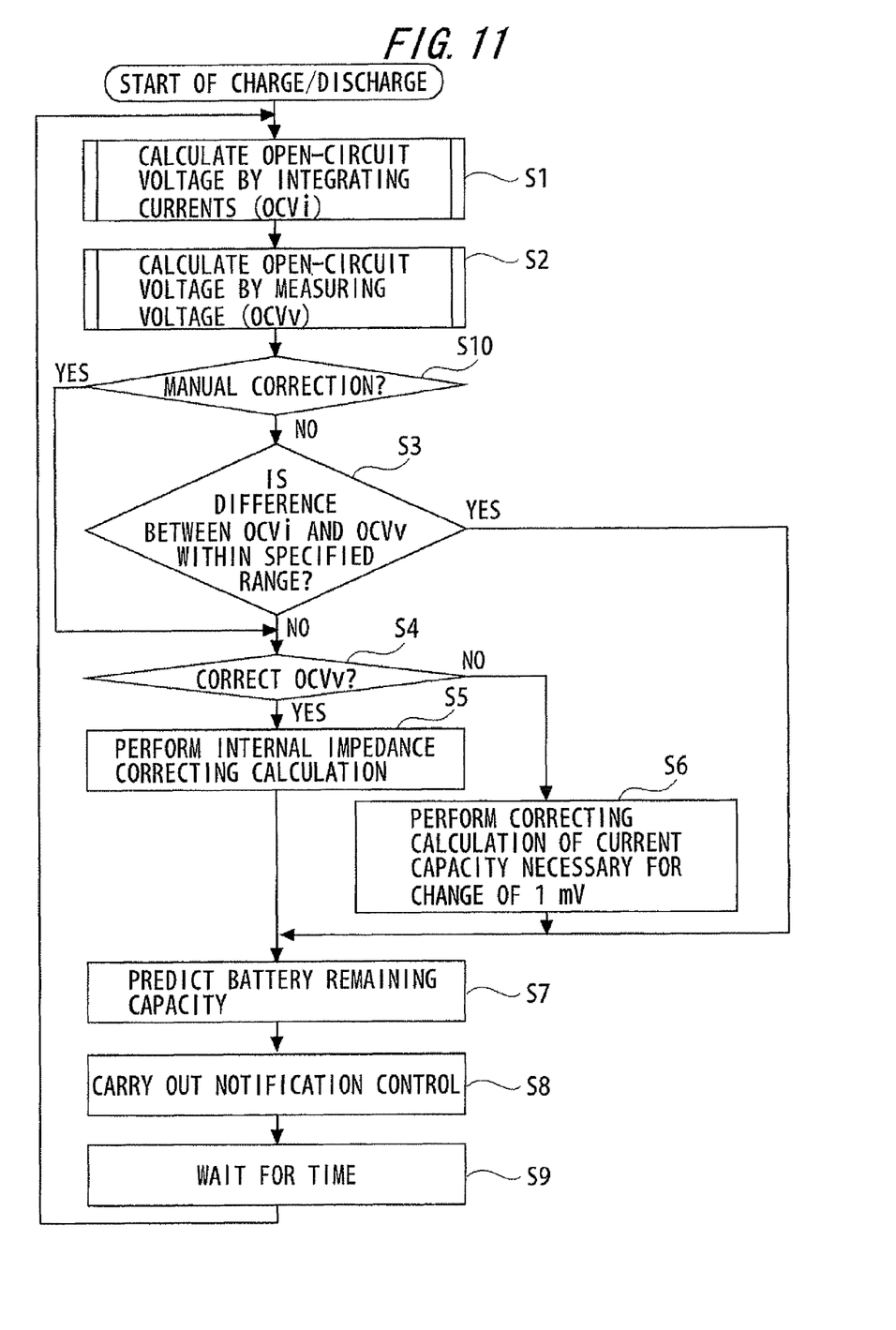
FIG. 11 is an explanatory flowchart of a modified example of a remaining capacity predicting method.

The electronic device 10 and the power source apparatus (remaining capacity predicting apparatus) 15 may also be enabled to select whether the correction is made or not, corresponding to a manual operation of the user as illustrated in FIG. 11.

In the present embodiment, the user clicks the icon 42 indicating the remaining capacity to display the menu, and, corresponding to a selecting operation such as selecting the manual correction, the arithmetic processing unit 12 stores information purporting the manual correction in the memory 23. Namely, a manual flag is set up.

Then, in the present embodiment, as shown in FIG. 11, after acquiring the estimated value of the open-circuit voltage and the measured value thereof in steps 1 and 2, the correcting unit 27 at first checks whether the manual flag is set up in the memory 27 (23) or not (S10), and, if setup therein, conducts the correction (manual correction) (S4-S6). Whereas if the manual flag is not set up, the correction (automatic correction) is carried out corresponding to a difference between the estimated value and the measured value (S3-S6).

It is to be noted that the correcting unit 27 may clear the manual flag after performing once the manual correction and may also clear the manual flag after a predetermined period of time or after conducting the manual correction a predetermined number of times. Moreover, another available scheme is that if the automatic correction is selected by the user's selecting operation in the same way as before, the automatic correction is cleared.

Further, the manual flag may also be a flag by which to show not only whether the manual correction is simply conducted or not but also whether the measured value is equalized to the estimated value or not (S5) and whether the estimated value is equalized to the measured value or not (S6).

Namely, when the user selects the correction with the measured value, the correcting unit 27 checks the manual flag (S10) and moves to step 5, in which the correcting unit 27 carries out the correction with the measured value. Further, when the user selects the correction with the estimated value, the correcting unit 27 checks the manual flag (S10) and moves to step 6, in which the correcting unit 27 performs the correction with the estimated value. This scheme enables the user to arbitrarily execute the correction.

Is should be noted that the present embodiment has exemplified the example of using the computer as the electronic device, however, the present invention is not limited to this type of electronic device, and the battery-driven electronic devices may be available such as a video camera, a digital camera, a portable audio player, a mobile phone and a cordless vacuum cleaner.

What is claimed is:

1. A battery remaining capacity predicting apparatus comprising:
   an integrating unit to integrate current values of charge or discharge of a battery at an interval of a predetermined period of time;
   a storage unit stored with conversion information representing a relation between amount of change of an open-circuit voltage of the battery and an integrated value of current; and
   an estimating unit to obtain, based on the conversion information in the storage unit, an estimated value of the open-circuit voltage by adding, to a previously estimated value of the open-circuit voltage, the amount of change of the open-circuit voltage of the battery which corresponds to the integrated current value of the charge or discharge of the battery at the interval of the predetermined period of time.

2. The battery remaining capacity predicting apparatus according to claim 1, further comprising a detecting unit to detect the current value of the charge or the discharge of the battery.

3. The battery remaining capacity predicting apparatus according to claim 1, further comprising a remaining capacity predicting unit to obtain a remaining capacity of the battery on the basis of the estimated value of the open-circuit voltage.

4. The battery remaining capacity predicting apparatus according to of claim 1, further comprising:
   a measuring unit to obtain a measured value of the open-circuit voltage on the basis of a charge current or a discharge current of the battery and information on the internal impedance of the battery; and
   a correcting unit to correct the information on the internal impedance so that the measured value of the open-circuit voltage is equalized to the estimated value of the open-circuit voltage.

5. The battery remaining capacity predicting apparatus according to claim 1, further comprising:
   a measuring unit to obtain a measured value of the open-circuit voltage on the basis of a charge current or a discharge current of the battery and information on the internal impedance of the battery; and
   a correcting unit to correct the conversion information so that the estimated value of the open-circuit voltage is equalized to the measured value of the open-circuit voltage.

6. The battery remaining capacity predicting apparatus according to claim 1, further comprising:
   a measuring unit to obtain a measured value of the open-circuit voltage on the basis of a charge current or a discharge current of the battery and information on the internal impedance of the battery; and
   a correcting unit to correct the information on the internal impedance so that the measured value of the open-circuit voltage is equalized to the estimated value of the open-circuit voltage, or to correct the conversion information so that the estimated value of the open-circuit voltage is equalized to the measured value of the open-circuit voltage.

7. The battery remaining capacity predicting apparatus according to claim 4, wherein the correction is made only when charging the battery with electricity or only when discharging the electricity from the battery.

8. The battery remaining capacity predicting apparatus according to claim 4, wherein when the remaining capacity of the battery is within a predetermined range, the correcting unit performs the correction.

9. The battery remaining capacity predicting apparatus according to claim 4, wherein when the voltage of the battery is within a predetermined range, the correcting unit performs the correction.

10. The battery remaining capacity predicting apparatus according to claim 4, wherein when a load of the battery becomes less than a predetermined load, the correcting unit performs the correction.

11. The battery remaining capacity predicting apparatus according to claim 4, wherein when stopping the charge and the discharge of the battery, the correcting unit performs the correction.

12. The battery remaining capacity predicting apparatus according to claim 4, wherein the correcting unit performs the correction at intervals of a predetermined period of time.

13. The battery remaining capacity predicting apparatus according to claim 8, wherein the correcting unit is enabled to select whether the correction is done automatically at an execution-of-correction timing or the correction is done in accordance with a manual operation of a user.

14. An electronic device comprising:
    a battery remaining capacity predicting apparatus according to claim 1;
    a determining unit determining, depending on whether or not at least one of an estimated value of an open-circuit voltage, a measured value of the open-circuit voltage, conversion information and information on internal impedance satisfies a predetermined condition, whether a remaining capacity of the battery is within predetermined accuracy or not; and a notification control unit notifying of a result of the determination.

15. An electronic device comprising:
a battery remaining capacity predicting apparatus according to claim 4; and
a notification control unit notifying of whether the correction is done or not.

16. A battery remaining capacity predicting method by which a battery remaining capacity predicting apparatus predicting a remaining capacity of a battery on the basis of an open-circuit voltage of the battery, executes:
integrating charge or discharge current values of the battery at an interval of a predetermined period of time; and
obtaining, based on conversion information representing a relation between amount of change of an open-circuit voltage of the battery and an integrated value of current, an estimated value of the open-circuit voltage by adding, to a previously estimated value of the open-circuit voltage, the amount of change of the open-circuit voltage of the battery in accordance with the integrated current value of the charge or discharge of the battery at the interval of the predetermined period of time.

17. The battery remaining capacity predicting method according to claim 16, wherein current values of the charge or the discharge of the battery are detected and then integrated.

18. The battery remaining capacity predicting method according to claim 16, wherein the remaining capacity of the battery is obtained based on an estimated value of the open-circuit voltage.

19. The battery remaining capacity predicting method according to claim 16, wherein a measured value of the open-circuit voltage is obtained based on the charge or discharge current of the battery and information on internal impedance of the battery, and the information on the internal impedance is corrected so that the measured value of the open-circuit voltage is equalized to the estimated value of the open-circuit voltage.

20. The battery remaining capacity predicting method according to claim 16, wherein a measured value of the open-circuit voltage is obtained based on the charge or discharge current of the battery and information on internal impedance of the battery, and the conversion information is corrected so that the estimated value of the open-circuit voltage is equalized to the measured value of the open-circuit voltage.

21. The battery remaining capacity predicting method according to claim 16, wherein a measured value of the open-circuit voltage is obtained based on the charge or discharge current of the battery and information on internal impedance of the battery, and the information on the internal impedance is corrected so that the measured value of the open-circuit voltage is equalized to the estimated value of the open-circuit voltage, or the conversion information is corrected so that the estimated value of the open-circuit voltage is equalized to the measured value of the open-circuit voltage.

22. A non-transitory recording medium recorded with a battery remaining capacity predicting program making a battery remaining capacity predicting apparatus predicting a remaining capacity of a battery on the basis of an open-circuit voltage of the battery, execute steps of:
integrating charge or discharge current values of the battery at an interval of a predetermined period of time; and
obtaining, based on conversion information representing a relation between amount of change of an open-circuit voltage of the battery and an integrated value of current, an estimated value of the open-circuit voltage by adding, to a previously estimated value of the open-circuit voltage, the amount of change of the open-circuit voltage of the battery in accordance with the integrated current value of the charge or discharge of the battery at the interval of the predetermined period of time.

23. The non-transitory recording medium according to claim 22, wherein current values of the charge or the discharge of the battery are detected and then integrated.

24. The non-transitory recording medium according to claim 22 or 23, further making the battery remaining capacity predicting apparatus execute a step of obtaining the remaining capacity of the battery on the basis of an estimated value of the open-circuit voltage.

25. The non-transitory recording medium according to claim 22, further making the battery remaining capacity predicting apparatus execute steps of:
obtaining a measured value of the open-circuit voltage on the basis of the charge or discharge current of the battery and information on internal impedance of the battery; and
correcting the information on the internal impedance so that the measured value of the open-circuit voltage is equalized to the estimated value of the open-circuit voltage.

26. The non-transitory recording medium according to claim 22, further making the battery remaining capacity predicting apparatus execute steps of:
obtaining a measured value of the open-circuit voltage on the basis of the charge or discharge current of the battery and information on internal impedance of the battery; and
correcting the conversion information so that the estimated value of the open-circuit voltage is equalized to the measured value of the open-circuit voltage.

27. The non-transitory recording medium according to claim 22, further making the battery remaining capacity predicting apparatus execute steps of:
obtaining a measured value of the open-circuit voltage on the basis of the charge or discharge current of the battery and information on internal impedance of the battery; and
correcting the information on the internal impedance so that the measured value of the open-circuit voltage is equalized to the estimated value of the open-circuit voltage, or correcting the conversion information so that the estimated value of the open-circuit voltage is equalized to the measured value of the open-circuit voltage.

* * * * *

UNITED STATES PATENT AND TRADEMARK OFFICE
CERTIFICATE OF CORRECTION

| | | |
|---|---|---|
| PATENT NO. | : 8,232,770 B2 | |
| APPLICATION NO. | : 12/022584 | |
| DATED | : July 31, 2012 | |
| INVENTOR(S) | : Masafumi Okumura | |

It is certified that error appears in the above-identified patent and that said Letters Patent is hereby corrected as shown below:

In the claims, the following corrections should be made:

Claim 4 (Column 11, line 67)
"according to of claim 1..." should be -- according to claim 1... --

Claim 14 (Column 12, line 64)
"a determining unit determining..." should be -- a determining unit to determine... --

Claim 14 (Column 13, line 4)
"a notification control unit notifying..." should be -- a notification control unit to notify... --

Claim 15 (Column 13, line 9)
"a notification control unit notifying..." should be -- a notification control unit to notify... --

Signed and Sealed this
Thirteenth Day of November, 2012

David J. Kappos
*Director of the United States Patent and Trademark Office*